United States Patent
Watanabe (10) Patent No.: US 6,825,668 B2
(45) Date of Patent: Nov. 30, 2004

(54) STATIC MAGNETIC FIELD GENERATING APPARATUS AND MAGNETIC RESONANCE IMAGING APPARATUS (75) Inventor: Takeshi Watanabe, Tokyo (JP)

(73) Assignee: GE Medical Systems Global Technology Company LLC, Waukesha, WI (US)

(*) Notice: Subject to any disclaimer, the term of this patent is extended or adjusted under 35 U.S.C. 154(b) by 0 days.

(21) Appl. No.: 10/712,424

(22) Filed: Nov. 13, 2003

(65) Prior Publication Data
US 2004/0095141 A1 May 20, 2004

(30) Foreign Application Priority Data
Nov. 14, 2002 (JP) .................................. 2002-330665

(51) Int. Cl.⁷ ............................................. G01V 3/00
(52) U.S. Cl. ................................... 324/320; 335/298
(58) Field of Search ............................ 324/320, 319, 324/318, 300, 307; 335/298, 302

(56) References Cited

U.S. PATENT DOCUMENTS

| | | | |
|---|---|---|---|
| 4,672,346 A | * | 6/1987 | Miyamoto et al. .......... 335/296 |
| 4,673,882 A | * | 6/1987 | Buford ........................ 324/320 |
| 4,899,109 A | | 2/1990 | Tropp et al. |
| 5,003,266 A | | 3/1991 | Palkovich et al. |
| 5,530,352 A | | 6/1996 | Kolem |
| 5,677,626 A | | 10/1997 | Miyazaki et al. |
| 5,773,976 A | | 6/1998 | Sakakura et al. |
| 6,340,888 B1 | * | 1/2002 | Aoki et al. ................. 324/319 |
| 6,489,770 B1 | | 12/2002 | Hirata |

FOREIGN PATENT DOCUMENTS

JP 2002-238872 8/2002

* cited by examiner

Primary Examiner—Louis Arana
(74) Attorney, Agent, or Firm—Carl B. Horton, Esq.; Armstrong Teasdale LLP (57) ABSTRACT For the purpose of providing a static magnetic field generating apparatus employing permanent magnets that allows easy adjustment of a static magnetic field, eight grooves are provided in a columnar yoke and the other opposing columnar yoke, and the shape or material of insert members is changed to modify magnetic resistance of the columnar yoke and the other opposing columnar yoke when the insert members are fitted; thus, magnetic flux formed in a space between permanent magnets can be easily modified, and hence, a static magnetic field can be easily adjusted.

15 Claims, 7 Drawing Sheets

STATIC MAGNETIC FIELD GENERATING APPARATUS AND MAGNETIC RESONANCE IMAGING APPARATUS

CROSS REFERENCE TO RELATED APPLICATIONS

This application claims the benefit of Japanese Application No. 2002-330665 filed Nov. 14, 2002.

The present invention relates to a static magnetic field generating apparatus and a magnetic resonance imaging apparatus employing permanent magnets supported by columnar yokes and base yokes forming a magnetic circuit.

In recent years, magnetic resonance imaging apparatuses in which a static magnetic field is generated by permanent magnets have become widespread. Because high accuracy is required in such apparatuses, a technique of adjusting the static magnetic field has been applied mainly by using iron pieces or the like on the permanent magnets themselves or on base yokes attached with the permanent magnets.

Another technique involves winding coils around columnar yokes for supporting the permanent magnets to electrically generate magnetic flux, thereby correcting the static magnetic field (see Patent Document 1, for example).
Patent Document 1
Japanese Patent Application Laid Open No. 2002-238872 (page 1, FIG. 10).

The conventional techniques, however, did not allow easy adjustment of the static magnetic field. Specifically, the technique of adjusting the static magnetic field on the permanent magnets themselves or on the base yokes attached with the permanent magnets must be completed in the assembling process of the magnetic resonance imaging apparatus on account of the weight of the permanent magnets, for example. On the other hand, the technique of electrically correcting the static magnetic field requires extra instruments because coils and a control device therefor are used.

Especially, the permanent magnet is more vulnerable to environmental conditions such as temperature change than a superconductive magnet, and the fact that the adjustment for maintaining accuracy of the static magnetic field cannot be easily achieved at an installation site such as a hospital, is not preferable from the viewpoint of performance and servicing efficiency.

It is therefore important to find a way to realize a static magnetic field generating apparatus and a magnetic resonance imaging apparatus employing permanent magnets that allow easy adjustment of a static magnetic field.

SUMMARY OF THE INVENTION

An object of the present invention is to provide a static magnetic field generating apparatus and a magnetic resonance imaging apparatus employing permanent magnets that allow easy adjustment of a static magnetic field.

For solving the aforementioned problems and attaining this object, a static magnetic field generating apparatus, in accordance with a first aspect of the invention, is characterized in comprising: a pair of permanent magnets opposingly disposed across a space in which a subject is placed; a pair of base yokes for supporting said permanent magnets; and columnar yokes for magnetically connecting said base yokes and structurally supporting them, said columnar yokes having magnetic resistance modifying means.

In the invention of the first aspect, permanent magnets are opposingly disposed across a space in which a subject is placed, the permanent magnets are supported by a pair of base yokes, and the base yokes are magnetically connected and structurally supported by columnar yokes having magnetic resistance modifying means; and therefore, magnetic flux generated in the space by the permanent magnets, hence, a static magnetic field that is equal to magnetic flux per unit area, can be easily changed and adjusted by modifying magnetic resistance of the columnar yokes.

The static magnetic field generating apparatus, in accordance with a second aspect of the invention, is characterized in that: said modifying means comprises a groove on a side surface of at least one of said columnar yokes, said side surface lying in a longitudinal direction of said columnar yoke.

In the invention of the second aspect, since a groove is provided on a side surface of the columnar yoke lying in a longitudinal direction of the columnar yoke as the modifying means, the cross-sectional area of the columnar yoke perpendicular to the longitudinal direction is reduced at the groove, thereby increasing magnetic resistance.

The static magnetic field generating apparatus, in accordance with a third aspect of the invention, is characterized in that: said groove has a rectangular cross section.

In the invention of the third aspect, since the groove has a rectangular cross section, it can be easily machined.

The static magnetic field generating apparatus, in accordance with a fourth aspect of the invention, is characterized in that: said modifying means comprises an insert member of a shape generally conforming to said groove.

In the invention of the fourth aspect, since an insert member of the modifying means has a shape generally conforming to the groove, magnetic resistance at the groove can be modified by inserting/removing the insert member into/from the groove.

The static magnetic field generating apparatus, in accordance with a fifth aspect of the invention, is characterized in that: said modifying means comprises a through hole passing through a side surface of at least one of said columnar yokes, said side surface lying in parallel with a longitudinal axis of said columnar yoke.

In the invention of the fifth aspect, since a through hole is provided to pass through a side surface of the columnar yoke lying in parallel with a longitudinal axis of the columnar yoke as the modifying means, the cross-sectional area of the columnar yoke perpendicular to the longitudinal axis is reduced at the through hole, thereby increasing magnetic resistance.

The static magnetic field generating apparatus, in accordance with a sixth aspect of the invention, is characterized in that: said through hole has a circular cross section.

In the invention of the sixth aspect, since the through hole has a circular cross section, reduction in strength of the columnar yokes for supporting the permanent magnets can be mitigated.

The static magnetic field generating apparatus, in accordance with a seventh aspect of the invention, is characterized in that: said modifying means comprises a filling member of a shape generally conforming to said through hole, said filling member being insertable/removable into/from said columnar yoke.

In the invention of the seventh aspect, since the modifying means comprises a filling member of a shape generally conforming to the through hole to be insertable/removable into/from the columnar yoke, magnetic resistance at the through hole can be modified by inserting/removing the filling member into/from the through hole.

The static magnetic field generating apparatus, in accordance with an eighth aspect of the invention, is characterized in that: said modifying means comprises a threaded hole provided on a side surface of at least one of said columnar yokes, said side surface lying in parallel with a longitudinal axis of said columnar yoke.

In the invention of the eighth aspect, since the modifying means comprises a threaded hole provided on a side surface of the columnar yoke lying in parallel with a longitudinal axis of the columnar yoke, the cross-sectional area of the columnar yoke perpendicular to the longitudinal axis is reduced at the threaded hole, thereby increasing magnetic resistance.

The static magnetic field generating apparatus, in accordance with a ninth aspect of the invention, is characterized in that: said modifying means comprises a screw of a shape generally conforming to said threaded hole, said screw being insertable/removable into/from said columnar yoke.

In the invention of the ninth aspect, since a screw of a shape generally conforming to the threaded hole serving as the modifying means is inserted/removed into/from the columnar yoke, magnetic resistance at the threaded hole can be modified by inserting/removing the screw into/from the threaded hole.

The static magnetic field generating apparatus, in accordance with a tenth aspect of the invention, is characterized in that: said groove, said through hole or said threaded hole is disposed on the side surface of said columnar yoke on the side where said space lies.

In the invention of the tenth aspect, since the groove, through hole or threaded hole is disposed on the side surface of the columnar yoke on the side where the space lies, magnetic flux leaking from the groove, through hole or threaded hole is efficiently returned to the permanent magnets, thereby efficiently modifying magnetic flux generated from the permanent magnets.

The static magnetic field generating apparatus, in accordance with an eleventh aspect of the invention, is characterized in that: said groove, said through hole or said threaded hole is disposed in a bending portion at which said permanent magnet and said columnar yoke are joined.

In the invention of the eleventh aspect, since the groove, through hole or threaded hole is disposed in a bending portion at which the permanent magnet and columnar yoke are joined, magnetic flux in the bending portion where magnetic flux is concentrated can be efficiently adjusted by the groove, through hole or threaded hole.

The static magnetic field generating apparatus, in accordance with a twelfth aspect of the invention, is characterized in that: said modifying means comprises a different-material portion provided within at least one of said columnar yokes and composed of a material having a different magnetic permeability from that of said columnar yoke.

In the invention of the twelfth aspect, since the modifying means comprises a different-material portion provided within the columnar yoke and composed of a material having a different magnetic permeability from that of the columnar yoke, magnetic resistance of the columnar yoke can be modified by a large amount for adjustment.

The static magnetic field generating apparatus, in accordance with a thirteenth aspect of the invention, is characterized in that: said different-material portion has a cross-sectional shape identical to a cross section perpendicularly intersecting the longitudinal axis of said columnar yoke.

In the invention of the thirteenth aspect, since the cross-sectional shape of the different-material portion is identical to a cross section perpendicularly intersecting the longitudinal axis of the columnar yoke, leakage of magnetic flux can be minimized.

The static magnetic field generating apparatus, in accordance with a fourteenth aspect of the invention, is characterized in that: a plurality of said groove, said through hole, said threaded hole or said different-material portion are disposed at symmetric positions of the respective columnar yokes with respect to the position of the subject.

In the invention of the fourteenth aspect, since a plurality of the groove, the through hole, the threaded hole or the different-material portion are disposed at symmetric positions of the respective columnar yokes with respect to the position of the subject, magnetic resistance can be equalized between the columnar yokes, and magnetic flux generated in the space can be homogenized without directionality.

A magnetic resonance imaging apparatus, in accordance with a fifteenth aspect of the invention, comprises: a static magnetic field generating apparatus for generating a static magnetic field using permanent magnets; gradient magnetic field generating means for generating a gradient magnetic field; transmitting/receiving means for transmitting/receiving a radio frequency magnetic field in said static magnetic field; and a control section for controlling said gradient magnetic field generating means, said transmitting means and said receiving means, said magnetic resonance imaging apparatus being characterized in that said static magnetic field generating apparatus comprises, in columnar yokes that magnetically connect and structurally support base yokes supporting a pair of opposingly disposed said permanent magnets, modifying means for modifying magnetic resistance of said columnar yokes.

In the invention of the fifteenth aspect, the static magnetic field generating apparatus comprises, in columnar yokes that magnetically connect and structurally support base yokes supporting a pair of opposingly disposed permanent magnets, modifying means for modifying magnetic resistance of the columnar yokes; and therefore, magnetic flux generated in the space by the permanent magnets, hence, a static magnetic field that is equal to magnetic flux per unit area, can be easily changed and adjusted by modifying magnetic resistance of the columnar yokes.

The magnetic resonance imaging apparatus, in accordance with a sixteenth aspect of the invention, is characterized in that: said modifying means comprises a groove on a side surface of at least one of said columnar yokes, said side surface lying in parallel with a longitudinal axis of said columnar yoke, a through hole passing through said side surface, or a threaded hole provided on said side surface; and an insert member of a shape generally conforming to said groove, a filling member of a shape generally conforming to said through hole, or a screw of a shape generally conforming to said threaded hole.

In the invention of the sixteenth aspect, the modifying means comprises a groove on a side surface of the columnar yoke lying in parallel with a longitudinal axis of the columnar yoke, a through hole passing through the side surface, or a threaded hole on the side surface, and an insert member of a shape generally conforming to the groove, a filling member of a shape generally conforming to the through hole, or a screw of a shape generally conforming to the threaded hole; and therefore, magnetic flux in the space can be easily adjusted with high accuracy by inserting/removing the insert member, filling member and screw into/from the groove, through hole and threaded hole.

According to the present invention, permanent magnets forming a pair are opposingly disposed across a space in which a subject is placed, the permanent magnets are supported by a pair of base yokes, and the permanent magnets are magnetically connected and structurally supported by columnar yokes having magnetic resistance modifying means; and therefore, magnetic flux generated in the space by the permanent magnets, hence, a static magnetic field that is equal to magnetic flux per unit area, can be easily modified and adjusted by changing magnetic resistance of the columnar yokes.

Further objects and advantages of the present invention will be apparent from the following description of the preferred embodiments of the invention as illustrated in the accompanying drawings.

DETAILED DESCRIPTION OF THE INVENTION

Preferred embodiments of the static magnetic field generating apparatus and magnetic resonance imaging apparatus in accordance with the present invention will be described hereinbelow with reference to the accompanying drawings.

Embodiment 1

Figure 1:
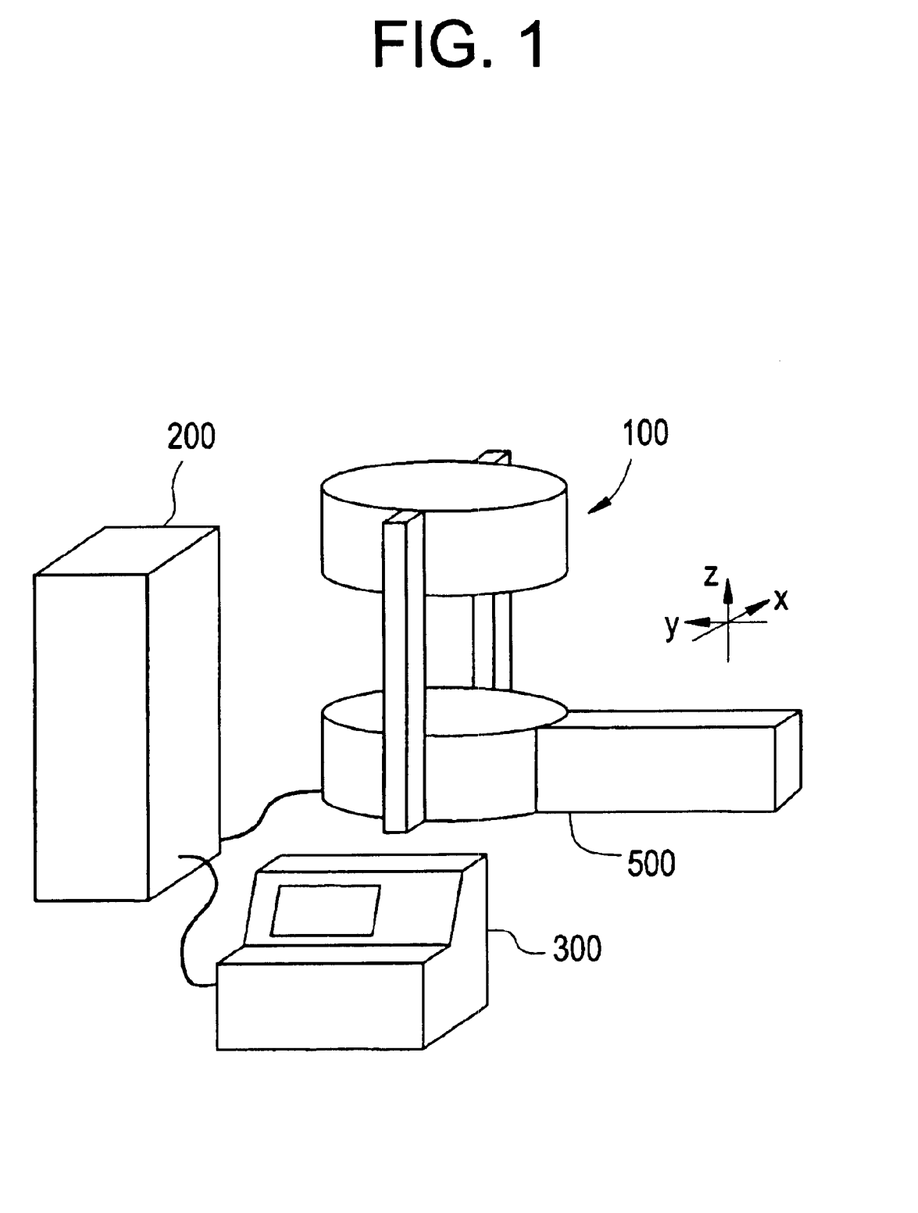
FIG. 1 is a block diagram showing the overall configuration of a magnetic resonance imaging apparatus.

The overall configuration of a magnetic resonance imaging apparatus in accordance with Embodiment 1 will first be described. FIG. 1 shows the overall configuration of the magnetic resonance imaging apparatus in accordance with Embodiment 1. In FIG. 1, the magnetic resonance imaging apparatus is comprised of a magnet section 100, a table section 500, a cabinet section 200, and an operation console section 300. These instruments are connected with one another by cables to communicate power, control information or data with one another.

The magnet section 100 generates a homogeneous static magnetic field, a gradient magnetic field and an RF magnetic field in a space between a pair of permanent magnets vertically and opposingly disposed. A subject is placed between the opposingly disposed permanent magnets.

The table section 500 is provided with a cradle (not shown) that moves through the space between the permanent magnets, on which cradle the subject is laid. The cradle is controlled to move so that an imaged portion in the subject is placed at a central portion of the magnet section 100.

The cabinet section 200 is comprised of electronic instruments for controlling the magnet section 100 and table section 500, and mainly conducts control of positioning of the subject, generation of the gradient magnetic field, transmission of the RF magnetic field, and reception of the RF magnetic field.

The operation console section 300 conducts input/output of control information, display of an output image and the like in response to an operation by an operator. The operator-input control information is transmitted to the cabinet section 200, and is used as control information for the magnet section 100 and table section 500.

Figure 2:
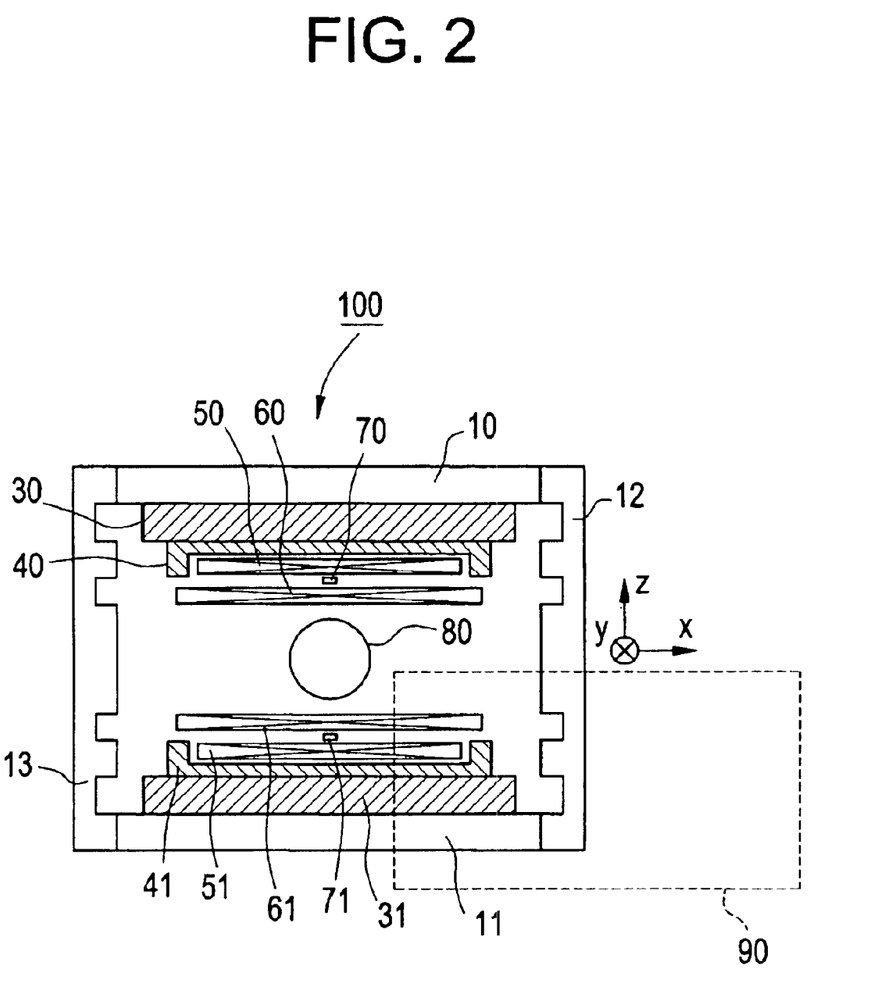
FIG. 2 shows a cross section of a magnet section in accordance with Embodiment 1.

FIG. 2 shows the detailed configuration of the magnet section 100. FIG. 2 shows an x-z cross section passing through the center of the magnet section 100. The magnet section 100 comprises a pair of base yokes 10 and 11, a pair of permanent magnets 30 and 31, a pair of gradient coils 50 and 51, a pair of NMR probes 70 and 71, and a pair of transmission coils 60 and 61, the members of each pair being vertically and opposingly disposed. A reception coil 80 is positioned in a central imaging region between the two opposingly disposed transmission coils 60 and 61. The subject is placed within the reception coil 80. The transmission coils 60 and 61 are fixed by means that is not shown at a distance from the gradient coils.

The opposingly disposed base yokes 10 and 11 are fixedly supported by columnar yokes 12 and 13. By this, the base yokes 10 and 11 define at their central portion an imaging region with high static magnetic field homogeneity in which the subject is placed.

The permanent magnets 30 and 31 are secured to the base yokes 10 and 11. The base yokes 10 and 11 and columnar yokes 12 and 13 form a magnetic circuit of a magnetic field generated by the permanent magnets 30 and 31 to reduce a magnetic field leaking to the outside and improve magnetic field homogeneity in the central imaging region.

Magnetic conditioning plates 40 and 41 are secured to the permanent magnets 30 and 31, and further improve magnetic field homogeneity in the central imaging region formed by the permanent magnets 30 and 31.

The gradient coils 50 and 51 generate a linear gradient magnetic field in the central imaging region. The transmission coils 60 and 61 generate an RF magnetic field in the central imaging region.

The NMR probes 70 and 71 are each comprised of a small phantom containing a solution of copper sulfide, for example, and a small coil surrounding the small phantom, and serve as a sensor for detecting the static magnetic field strength in the central imaging region formed by the permanent magnets. The output from the sensor is displayed on, for example, the operation console section 300 via the cabinet section 200.

Figure 3:
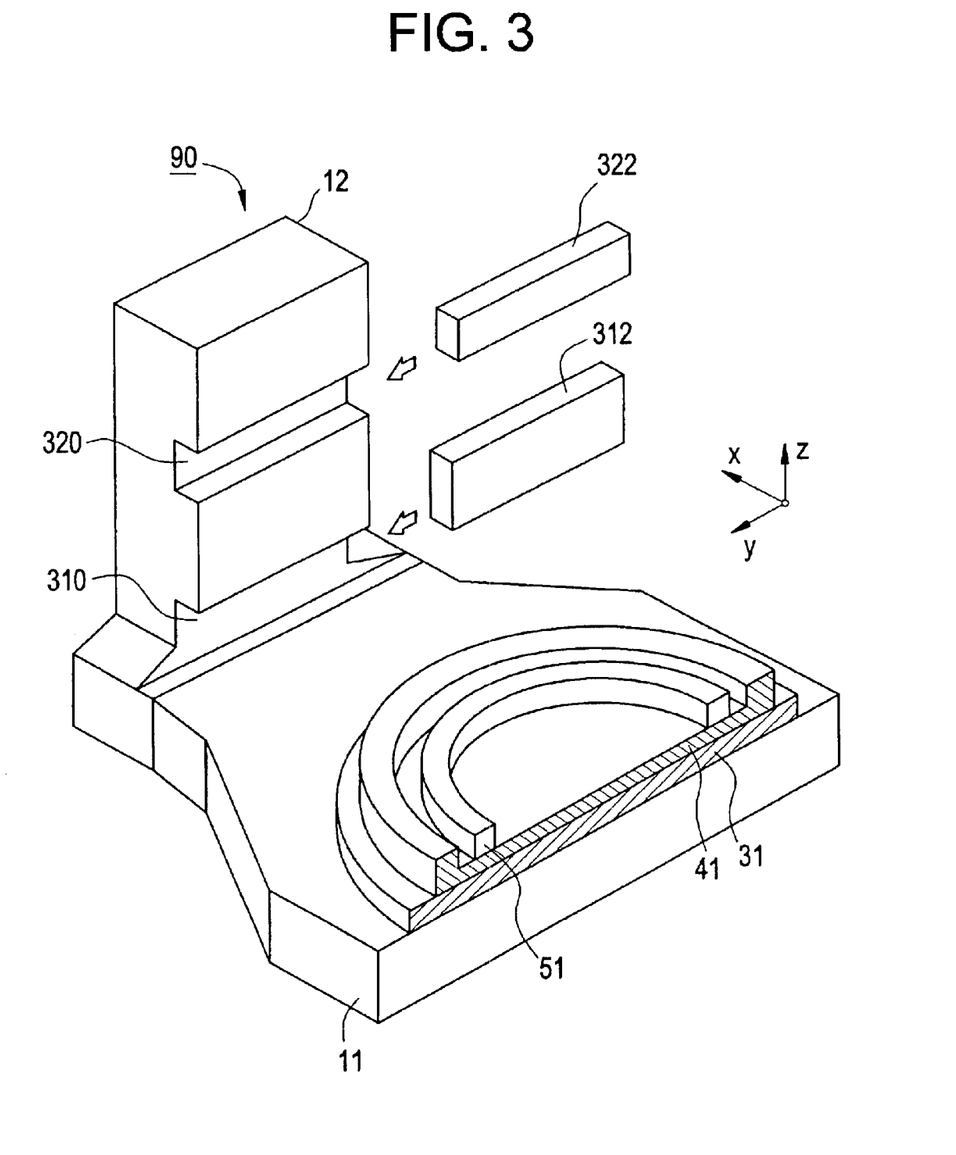
FIG. 3 shows a partial configuration of the magnet section around a columnar yoke in accordance with Embodiment 1.

Next, FIG. 3 shows a partial configuration diagram of the magnet section 100 around the columnar yoke 12. FIG. 3 is shown constituting a generally quarter component part 90 of the magnet section 100 shown in FIG. 2. The magnet section 100 forms a symmetric structure with respect to the reception coil 80 in which the subject is placed, and the upper half of the columnar yoke 12 in the z-direction and the columnar yoke 13 have exactly the same structure as the component part 90. The transmission coil 61 is omitted from the drawing.

The columnar yoke 12 is provided with grooves 310 and 320 on its side surface that lies in parallel with a longitudinal direction supporting the base yokes 10 and 11. The grooves 310 and 320 have their bottom surfaces facing the side where the permanent magnet 31 lies. In particular, the groove 310 is provided in a bending portion that is created at a joint portion of the base yoke 11 and columnar yoke 12. The number of the grooves is not limited to two, and it may be three or more; moreover, the grooves may be provided on a surface of the columnar yoke 12 on the side where the permanent magnet 31 does not lie.

Moreover, insert members 312 and 322 of a shape conforming to the grooves 310 and 320 are employed. The insert members 312 and 322 are appropriately conforming to the grooves 310 and 320 for adjusting the static magnetic field strength. An exemplary material employed for the insert members 312 and 322 is iron similar to that of the columnar yoke 12, although a magnetic material having a higher or lower magnetic permeability may be used taking into account the effect of correction on the static magnetic field strength. Although the insert members 312 and 322 are configured to have a shape conforming to the grooves 310 and 320, the effect of correction on the static magnetic field strength may be modified by changing their thickness in the x-direction and length in the y-direction.

The operation of the magnet section 100 employing the columnar yokes 12 and 13 having groove portions represented by the grooves 310 and 320 will next be described with reference to a magnetic circuit shown in FIG. 4. FIG. 4 schematically shows a magnetic circuit and a static magnetic field distribution of the magnet section 100.

Now consider the relationship among magnetic flux $\phi$, magnetomotive force F and magnetic resistance R in the magnetic circuit. There is the relationship represented by:

$$\phi = F/R \tag{1}$$

among the magnetic flux $\phi$, magnetomotive force F and magnetic resistance R, similarly to Ohm's law in electricity. Moreover, the magnetic resistance R is represented by:

$$R = (1/\mu) \times (L/A). \tag{2}$$

In this equation, $\mu$ is the magnetic permeability, L is the length of the magnetic path, and A is the cross-sectional area of the magnetic path; and for the columnar yokes 12 and 13 in the magnet section 100, $\mu$ is the magnetic permeability of iron, L is the length in the longitudinal direction (z-direction), and A is the area of a cross section perpendicular to the longitudinal axis.

Figure 4A:
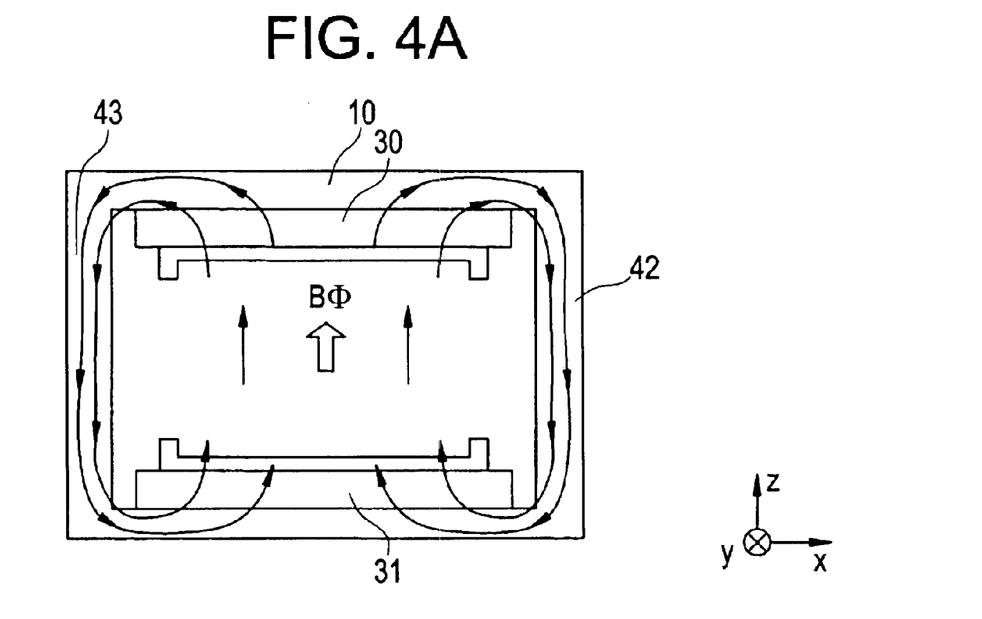
FIG. 4 shows a magnetic circuit in the magnet section in accordance with Embodiment 1.

FIG. 4(A) shows a conventional magnet section, in which columnar yokes 42 and 43 each have a uniform cross-sectional area A2 in the x-y plane. The magnetomotive force F is at a certain value determined by the permanent magnets 30 and 31. The total magnetic resistance R0 is represented by the sum of the magnetic resistance R1 in the space between the permanent magnets 30 and 31 in which the subject or reception coil 80 is placed, and the magnetic resistance R2 in the return path of magnetic flux formed by the base yokes 10 and 11 and columnar yokes 42 and 43, which is given by:

$$R0 = R1 + R2.$$

Thus, magnetic flux $\phi 0$ determined by Equation (1) is generated in the space between the permanent magnets 30 and 31 in which the reception coil 80 is placed.

Figure 4B:
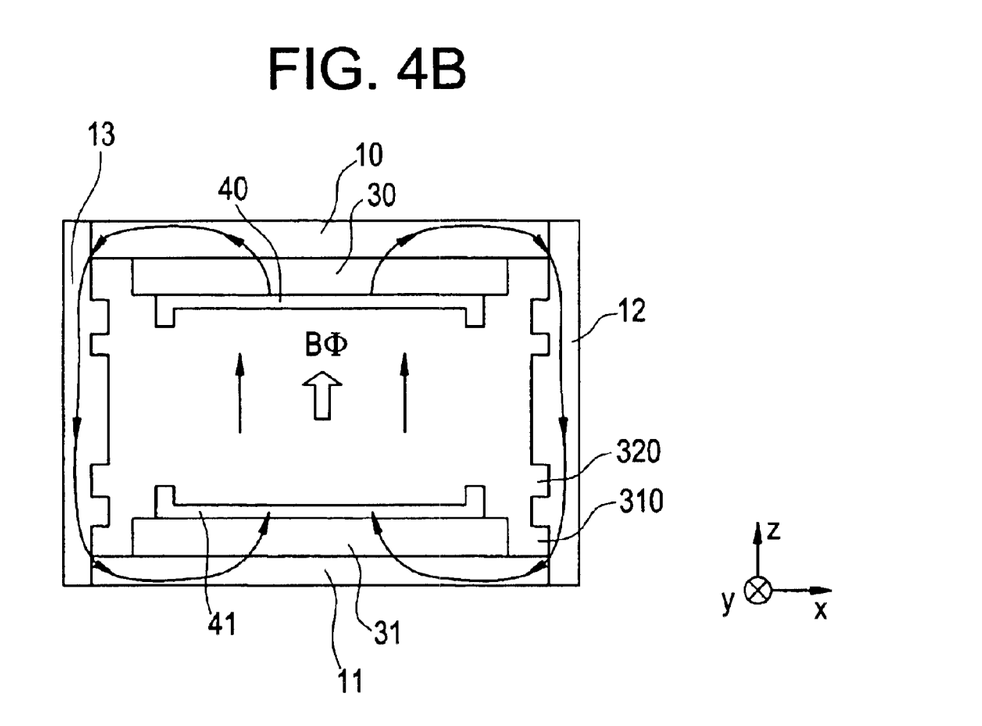

FIG. 4(B) shows the magnet section 100 in which the columnar yokes 12 and 13 of Embodiment 1 are employed. In this case, the columnar yokes 12 and 13 have eight grooves represented by the grooves 310 and 320. The cross-sectional area A3 of a cross section in the x-y plane including these grooves is:

$$A3 < A2.$$

Therefore, a return path of magnetic flux formed by the base yokes 10 and 11 and columnar yokes 12 and 13 shown in FIG. 4(B) has a magnetic resistance R3 such that:

$$R3 > R2$$

from Equation (2). Since the total magnetic resistance R4 for FIG. 4(B) is R4=R1+R3, magnetic flux $\phi 1$ determined by Equation (1) is:

$$\phi 1 < \phi 0,$$

which means that the magnetic flux $\phi 1$ is less than that of FIG. 4(A), resulting in reduced static magnetic flux or a smaller static magnetic field B0 that is equal to magnetic flux per unit area.

Moreover, since high magnetic resistance is present at the eight grooves represented by the grooves 310 and 320, the magnetic flux leaks out of the columnar yokes 12 and 13, thereby forming a closed loop of a magnetic line of force that is closed by the nearest permanent magnet 30 or 31. Thus, the magnetic flux $\phi$ generated in the space between the permanent magnets 30 and 31 in which the reception coil 80 is placed is reduced, resulting in a smaller static magnetic field B0.

Furthermore, the magnetic resistance of the columnar yoke 12 or 13 can be modified between R3 and R2 to modify or adjust the magnetic flux between $\phi 1$ and $\phi 0$ by appropriately fitting the insert members 312 and 322 in the grooves 310 and 320 or in the other grooves on the columnar yoke 12 or 13. In addition, the magnetic resistance can be adjusted more finely to finely adjust the magnetic flux with high accuracy by adjusting or changing the thickness, length or material of the insert members 312 and 322.

Alternatively, a material that has a higher magnetic permeability than the columnar yoke 12 or 13 may be selected for the insert members 312 and 322 to reduce the total magnetic resistance R4 so that:

$$R4 < R2$$

to obtain magnetic flux $\phi 1$ such that:

$$\phi 1 > \phi 0.$$

In this case, the magnetic flux $\phi$ formed in the space is increased, resulting in a greater static magnetic field B0.

As described above, in Embodiment 1, eight grooves represented by the grooves 310 and 320 are provided in the columnar yokes 12 and 13, and the shape or material of the insert members 312 and 322 is changed to modify the magnetic resistance of the columnar yokes 12 and 13 when the insert members 312 and 322 are fitted; thus, the magnetic flux formed in the space between the permanent magnets 30 and 31 can be easily modified, and hence, the static magnetic field B0 can be easily adjusted.

Although the magnetic resistances of the columnar yokes 12 and 13 are equal in Embodiment 1, they may be differentiated by adjustment of the insert member 312 or 322 to adjust homogeneity of the magnetic flux generated in the space.

Embodiment 2

While magnetic resistance of the columnar yokes 12 and 13 is modified to modify magnetic flux using the grooves 310 and 320 having a rectangular cross section and the insert members 312 and 322 of a shape generally conforming to the grooves 310 and 320 in Embodiment 1, the magnetic resonance may be modified by providing through holes or threaded holes in the columnar yokes. In Embodiment 2, a case in which through holes or threaded holes are provided in the columnar yokes to modify the magnetic resistance of the columnar yokes will be described.

Figure 5:
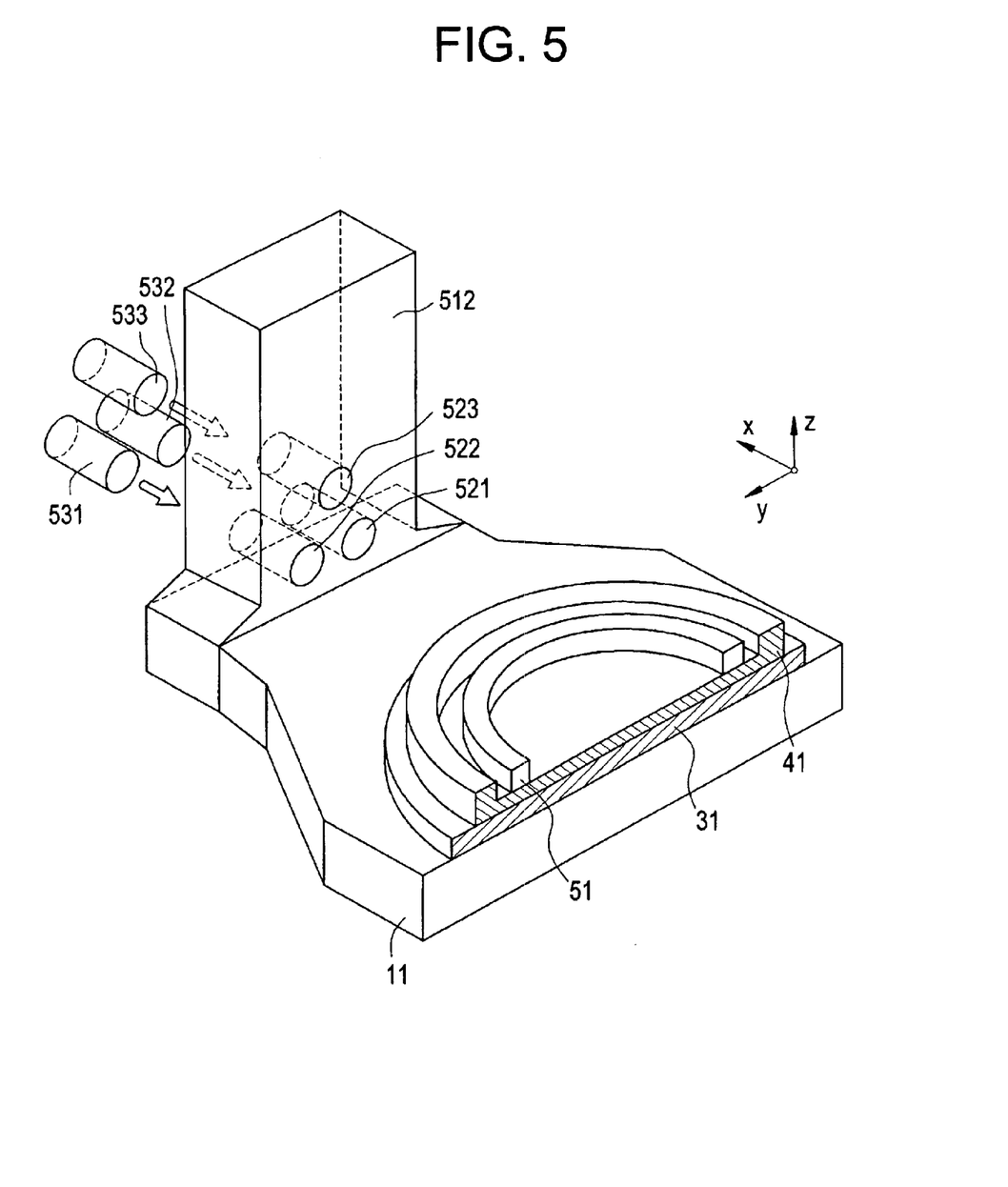
FIG. 5 shows a partial configuration of the magnet section around a columnar yoke in accordance with Embodiment 2 (first configuration).

FIG. 5 shows a partial configuration diagram of the magnet section around a columnar yoke 512 provided with through holes. FIG. 5 is shown constituting a generally quarter component part 90 of the magnet section 100 shown in FIG. 2, and corresponds to FIG. 3. The magnet section having the columnar yoke 512 shown in FIG. 5 has exactly the same structure as the magnet section 100 except for the columnar yokes 12 and 13, and detailed description thereof will be omitted.

The magnet section having the columnar yoke 512 provided with through holes has a symmetric structure with respect to the reception coil 80 in which the subject is placed, and the upper half of the columnar yoke 512 in the z-direction and the columnar yoke lying at a symmetrical position in the x-direction have exactly the same structure.

The columnar yoke 512 has through holes 521—523. The through holes 521—523 have a circular cross section, and-pass through the columnar yoke 512 in the x-direction from a side surface of the columnar yoke 512 on the side where the permanent magnet 31 lies. Moreover, filling members 531—533 of a shape generally conforming to the through holes 521—523 are present and appropriately inserted in the through holes 521—523. Although the material employed for the filling members 531—533 is the same as the columnar yoke 512, for example, a material having a different magnetic permeability may be appropriately used depending upon the adjustment range of magnetic flux. The number of through holes is not limited to three, and it may be increased/decreased depending upon the amount of change in magnetic resistance, and also the direction of passing-through may be changed.

Since the columnar yoke 512 has a smaller cross-sectional area in an x-y cross section that includes any one of through holes 521—523, the magnetic resistance is increased, thus reducing the magnetic flux according to Equation (1). Moreover, the magnetic resistance of the columnar yoke 512 can be adjusted more finely to finely adjust the magnetic flux with high accuracy by changing the length, material or the like of the filling members 531—533.

Figure 6:
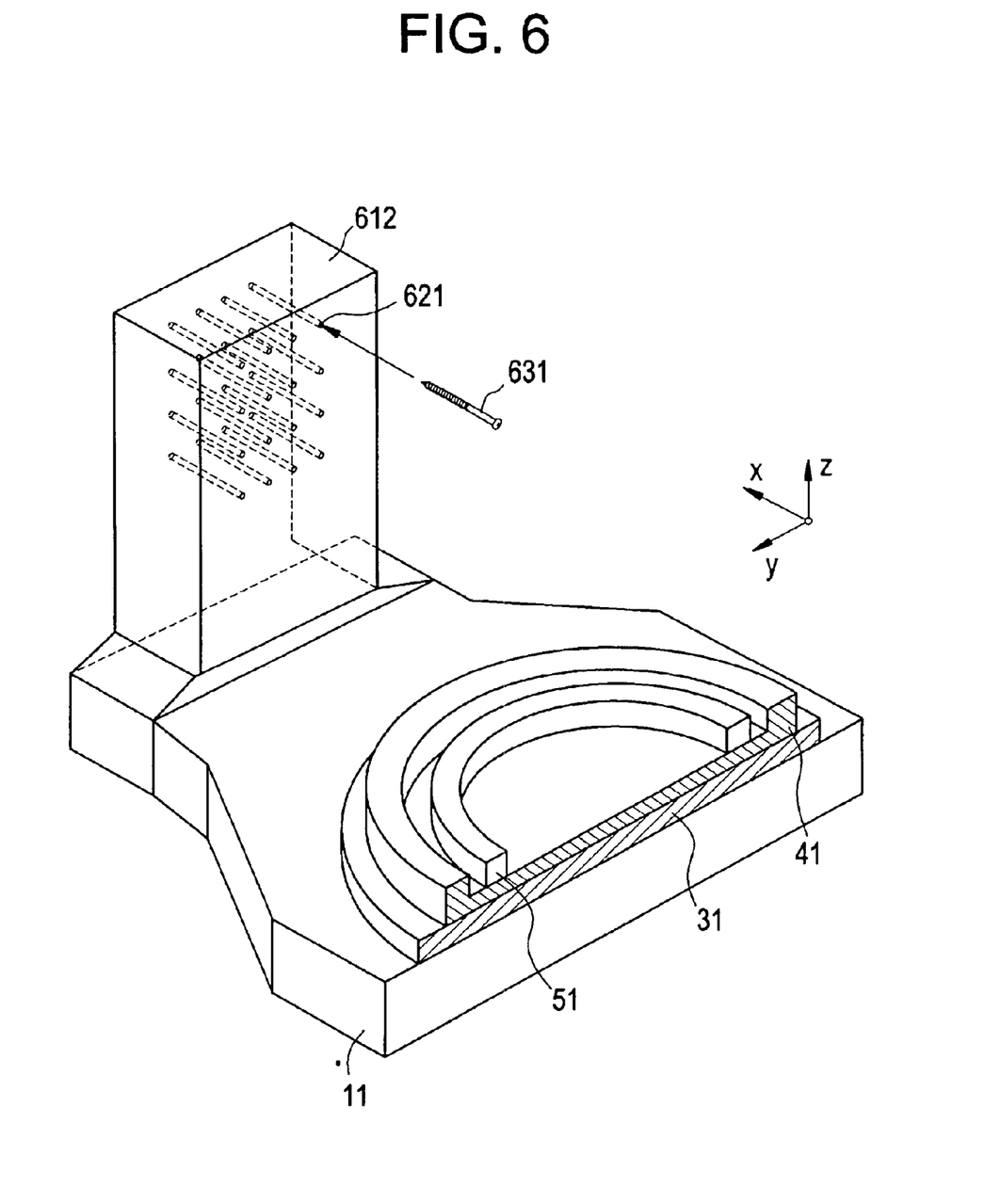
FIG. 6 shows a partial configuration of the magnet section around a columnar yoke in accordance with Embodiment 2 (second configuration).

FIG. 6 shows a partial configuration diagram of the magnet section around a columnar yoke 612 provided with threaded holes 621. FIG. 6 is shown constituting a generally quarter component part 90 of the magnet section 100 shown in FIG. 2, and corresponds to FIG. 3. The magnet section having the columnar yoke 612 shown in FIG. 6 has exactly the same structure as the magnet section 100 except the columnar yokes 12 and 13, and detailed description thereof will be omitted.

The magnet section having the columnar yoke 612 provided with threaded holes 621 has a symmetric structure with respect to the reception coil 80 in which the subject is placed, and the upper half of the columnar yoke 612 in the z-direction and the columnar yoke lying at a symmetrical position in the x-direction have exactly the same structure.

The columnar yoke 612 has a threaded hole 621 and a plurality of threaded holes having exactly the same structure as the threaded hole 621. The threaded hole 621 and other threaded holes are provided on the columnar yoke 612 in the x-direction from the side surface of the columnar yoke 612 on the side where the permanent magnet 31 lies. Moreover, at least one screw 631 of a shape engageable in the threaded hole 621 and other threaded holes is provided and is appropriately inserted in the threaded hole 621 and other threaded holes.

Since the columnar yoke 612 has a smaller cross-sectional area in an x-y cross section that includes any one of the threaded hole 621 and other threaded holes, the magnetic resistance is increased, thus reducing the magnetic flux according to Equation (1). Moreover, the magnetic resistance of the columnar yoke 612 can be adjusted more finely to finely adjust the magnetic flux with high accuracy by changing the length, material or the like of the screw 631.

As described above, in Embodiment 2, through holes or threaded holes are provided in the columnar yoke, and the shape and material of the filling members or screws are changed to adjust the magnetic resistance of the columnar yoke when the filling members and screws are fitted; thus, the magnetic flux formed in the space between the permanent magnets 30 and 31 can be easily modified, and hence, the static magnetic field B0 can be easily adjusted.

Embodiment 3

While the magnetic resistance is modified by providing through holes or threaded holes in the columnar yoke in Embodiment 2, the magnetic resistance may be modified by providing a different-material portion in the columnar yoke. In Embodiment 3, a case in which a different-material portion is provided in the columnar yoke to modify the magnetic resistance of the columnar yoke will be described.

Figure 7:
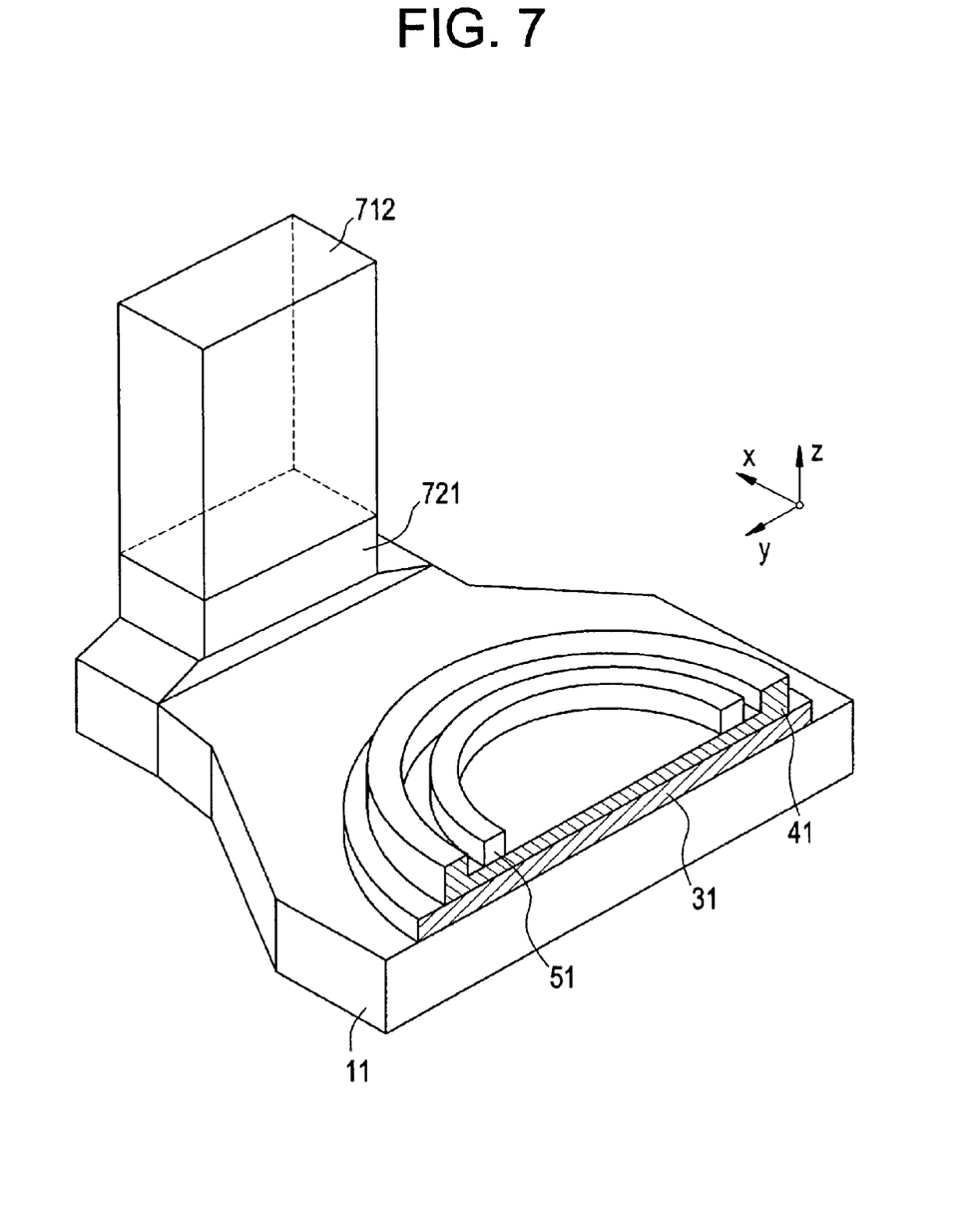
FIG. 7 shows a partial configuration of the magnet section around a columnar yoke in accordance with Embodiment 3.

FIG. 7 shows a partial configuration diagram of the magnet section around a columnar yoke 712 provided with a different-material portion 721. FIG. 7 is shown constituting a generally quarter component part 90 of the magnet section 100 shown in FIG. 2, and corresponds to FIG. 3. The magnet section having the columnar yoke 712 shown in FIG. 7 has exactly the same structure as the magnet section 100 except for the columnar yokes 12 and 13, and detailed description thereof will be omitted.

The magnet section having the columnar yoke 712 provided with the different-material portion 721 has a symmetric structure with respect to the reception coil 80 in which the subject is placed, and the upper half of the columnar yoke 712 in the z-direction and the columnar yoke lying at a symmetrical position in the x-direction have exactly the same structure.

The columnar yoke 712 has the different-material portion 721. The different-material portion 721 lies at a bending portion at which the base yoke 11 and columnar yoke 712 are joined. The different-material portion 721 is composed of a material having a different magnetic permeability from that of the columnar yoke 712, such as Permalloy, and it reduces the magnetic resistance of the columnar yoke 712, especially suppresses an increase of the magnetic resistance that occurs at the bending portion, and reduces leak magnetic flux. Moreover, variation in the magnetic flux due to the permanent magnets 30 and 31 can be controlled by adjusting the thickness of the different-material portion 721 in the manufacture process.

As described above, since the different-material portion is provided in the columnar yoke to adjust the magnetic resistance of the columnar yoke in Embodiment 3, the magnetic flux formed in the space between the permanent magnets 30 and 31 can be modified in the manufacture process, and hence, the static magnetic field B0 can be adjusted.

Many widely different embodiments of the invention may be configured without departing from the spirit and the scope of the present invention. It should be understood that the present invention is not limited to the specific embodiments described in the specification, except as defined in the appended claims.

What is claimed is:

1. A static magnetic field generating apparatus comprising:
    a pair of permanent magnets opposingly disposed across a space in which a subject is placed;
    a pair of base yokes for supporting said permanent magnets; and columnar yokes for magnetically connecting said base yokes and structurally supporting said base yokes, said columnar yokes having a magnetic resistance modifying device, wherein said modifying device includes a material portion including a material having a magnetic permeability different from a magnetic permeability of one of said columnar yokes, and said material portion has a cross-sectional shape identical to a cross section perpendicularly intersecting a longitudinal axis of one of said columnar yokes.

2. The static magnetic field generating apparatus of claim 1, wherein said modifying device comprises a groove on a side surface of at least one of said columnar yokes, said surface lying in parallel with the longitudinal axis.

3. The static magnetic field generating apparatus of claim 2, wherein said groove, through hole or a threaded hole is disposed on the side surface of said columnar yoke on a side where said space lies.

4. The static magnetic field generating apparatus of claim 3, wherein said groove, said through hole or said threaded hole is disposed in a bending portion at which said base yoke and said columnar yoke are joined.

5. The static magnetic field generating apparatus of claim 2, wherein a plurality of at least one of grooves, through holes, threaded holes, and material portions are disposed at symmetric positions of respective ones of said columnar yokes with respect to a position of the subject.

6. The static magnetic field generating apparatus of claim 2, wherein said groove has a rectangular cross section.

7. The static magnetic field generating apparatus of claim 2, wherein said modifying device comprises an insert member of a shape generally conforming to said groove, said insert member being inserted/removed into/from one of said columnar yokes.

8. The static magnetic field generating apparatus of claim 1, wherein said modifying device comprises a through hole passing through a side surface of at least one of said columnar yokes, said side surface lying in parallel with the longitudinal axis.

9. The static magnetic field generating apparatus of claim 8, wherein said through hole has a circular cross section.

10. The static magnetic field generating apparatus of claim 8, wherein said modifying device comprises a filling member of a shape generally conforming to said through hole, said filling member being inserted/removed into/from one of said columnar yokes.

11. The static magnetic field generating apparatus of claim 1, wherein said modifying device comprises a threaded hole provided on a side surface of at least one of said columnar yokes, said side surface lying in parallel with a longitudinal axis of one of said columnar yokes.

12. The static magnetic field generating apparatus of claim 11, wherein said modifying device comprises a screw of a shape engageable in said threaded hole, said screw being inserted/removed into/from one of said columnar yokes.

13. A magnetic resonance imaging apparatus comprising:
a static magnetic field generating apparatus for generating a static magnetic field using permanent magnets;
a gradient magnetic field generating device for generating a gradient magnetic field;
a transmitting/receiving device for transmitting/receiving a radio frequency magnetic field in said static magnetic field; and
a control section for controlling said gradient magnetic field generating device, said transmitting device and said receiving device, wherein
said static magnetic field generating apparatus comprises, in columnar yokes that magnetically connect and structurally support base yokes supporting a pair of opposingly disposed said permanent magnets, a modifying device for modifying magnetic resistance of said columnar yokes, wherein said modifying device includes a material portion including a material having a magnetic permeability different from a magnetic permeability of said columnar yoke, and said material portion has a cross-sectional share identical to a cross section perpendicularly intersecting a longitudinal axis of said columnar yoke.

14. The magnetic resonance imaging apparatus of claim 13, wherein said modifying device comprises a groove on a side surface of at least one of said columnar yokes, a through hole passing through said side surface, or a threaded hole provided on said side surface, and an insert member of a shape generally conforming to said groove, a filling member of a shape generally conforming to said through hole, or a screw of a shape engaged in said threaded hole, said side surface lying in parallel with the longitudinal axis.

15. A static magnetic field generating apparatus comprising:
a pair of permanent magnets opposingly disposed across a space in which a subject is planed;
a pair of base yokes for supporting said permanent magnets; and
columnar yokes for magnetically connecting said base yokes and structurally supporting said base yokes, said columnar yokes having a magnetic resistance modifying device, wherein said modifying device includes a groove on a side surface of at least one of said columnar yokes, said surface lying in parallel with a longitudinal axis of one of said columnar yokes, and said groove has a rectangular cross section.

* * * * *

UNITED STATES PATENT AND TRADEMARK OFFICE
CERTIFICATE OF CORRECTION

PATENT NO. : 6,825,668 B2
APPLICATION NO. : 10/712424
DATED : November 30, 2004
INVENTOR(S) : Takeshi Watanabe It is certified that error appears in the above-identified patent and that said Letters Patent is hereby corrected as shown below:

In Claim 13, column 12, line 25, delete "share" and insert therefor -- shape --.

In Claim 15, column 12, line 41, delete "planed" and insert therefor -- placed --.

Signed and Sealed this

Fifteenth Day of August, 2006

JON W. DUDAS
*Director of the United States Patent and Trademark Office*